(12) United States Patent
Onishi (10) Patent No.: US 10,952,360 B2
(45) Date of Patent: Mar. 16, 2021

(54) COMPONENT MOUNTER AND COMPONENT HOLDER IMAGING METHOD

(71) Applicant: YAMAHA HATSUDOKI KABUSHIKI KAISHA, Shizuoka (JP)

(72) Inventor: Tadashi Onishi, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 416 days.

(21) Appl. No.: 15/757,632

(22) PCT Filed: Sep. 30, 2015

(86) PCT No.: PCT/JP2015/077768
§ 371 (c)(1),
(2) Date: Mar. 5, 2018

(87) PCT Pub. No.: WO2017/056239
PCT Pub. Date: Apr. 6, 2017

(65) Prior Publication Data
US 2018/0249611 A1    Aug. 30, 2018

(51) Int. Cl.
*H05K 13/08* (2006.01)
*H05K 13/04* (2006.01)
(Continued)

(52) U.S. Cl.
CPC ........... *H05K 13/08* (2013.01); *H04N 5/2257* (2013.01); *H04N 5/232* (2013.01); *H04N 5/247* (2013.01);
(Continued)

(58) Field of Classification Search
CPC ........ H05K 3/041; H05K 3/08; H05K 3/0813; H05K 13/041; H05K 13/08;
(Continued)

(56) References Cited

U.S. PATENT DOCUMENTS

2012/0159781 A1* 6/2012 Masahiro ............. H05K 13/041
29/834

FOREIGN PATENT DOCUMENTS

JP    2001-352196 A    12/2001
JP    2001352196 A *  12/2001
(Continued)

OTHER PUBLICATIONS

International Search Report issued in PCT/JP2015/077768; dated Dec. 15, 2015.
(Continued)

*Primary Examiner* — Livius R. Cazan
(74) *Attorney, Agent, or Firm* — Studebaker & Brackett PC (57) ABSTRACT

A component mounter comprises a mounting head that holds a plurality of nozzles. Two imaging positions are provided for the circumferential orbit along which the nozzles of the mounting head are arranged. While the nozzles are rotated continuously about the rotation axis, an operation of imaging the nozzles located at the imaging positions is performed for each of the imaging positions. Therefore, in a period when the nozzles rotate by an angle not larger than a predetermined angle around the rotation axis formed by the interval between the two imaging positions adjacent to each other along the circumferential orbit, imaging of the nozzles can be completed by locating each of the nozzles at one of the two imaging positions. As a result, it becomes possible to image the plurality of nozzles of the mounting head efficiently.

17 Claims, 8 Drawing Sheets

(51) Int. Cl.
    *H04N 5/225* (2006.01)
    *H04N 5/247* (2006.01)
    *H04N 5/232* (2006.01)

(52) U.S. Cl.
    CPC ....... *H05K 13/041* (2018.08); *H05K 13/0813* (2018.08); *Y10T 29/53174* (2015.01)

(58) Field of Classification Search
    CPC .......... H05K 13/0813; Y10T 29/53174; Y10T 29/53178; Y10T 29/53183
    See application file for complete search history.

(56) References Cited

FOREIGN PATENT DOCUMENTS

| JP | 2005-116874 A | | 4/2005 |
|---|---|---|---|
| JP | 2005116874 A | * | 4/2005 |
| JP | 2008-311476 A | | 12/2008 |
| JP | 2012-238726 A | | 12/2012 |
| JP | 5511912 B2 | | 6/2014 |

OTHER PUBLICATIONS

Written Opinion issued in PCT/JP2015/077768; dated Dec. 15, 2015.

* cited by examiner

COMPONENT MOUNTER AND COMPONENT HOLDER IMAGING METHOD

CROSS-REFERENCE TO RELATED APPLICATION

This application is a National Stage of International Patent Application No. PCT/JP2015/077768, filed Sep. 30, 2015, the entire content of which is incorporated herein by reference.

BACKGROUND

Technical Field

The present disclosure relates to a component mounting technique using a rotary head configured to rotatably hold a plurality of component holders arranged along a circumferential orbit centered at a predetermined rotation axis.

Background Art

A component mounting device disclosed in Japanese Patent Publication No. 5511912 rotatably holds a plurality of nozzles arranged in a circumferential pattern in a rotation direction and attaches a component to a board with use of a nozzle located at an attachment station provided at a predetermined position in the rotation direction. In such a device, a nozzle is imaged for the purpose of determining that a component is sucked by the nozzle before attachment of the component or a component has come off the nozzle after attachment of the component, for example.

SUMMARY

Regarding a component mounting technique using a rotary head configured to rotatably hold a plurality of component holders (nozzles), to shorten the time required for component mounting on a board, increasing significance has been given in recent years to efficient imaging of the plurality of component holders of the rotary head. However, Japanese Patent Publication No. 5511912 mentioned above does not provide sufficient means for responding to such significance of efficient imaging of the component holders.

The present disclosure has been made in view of the above-described problem. The present disclosure is intended to provide a technique allowing efficient imaging of a plurality of component holders of a rotary head.

A component mounter according to the present disclosure comprises a rotary head that holds N component holders arranged along a circumferential orbit centered at a predetermined rotation axis and configured to rotate integrally about the rotation axis, with N being an integer of 2 or more; an imaging unit configured to have L imaging positions provided for the circumferential orbit and image a component holder located at the imaging position, with L being an integer of 2 or more; and a controller configured to execute an imaging sequence to complete imaging of the N component holders by making the imaging unit perform an operation of imaging the component holder located at the imaging position in turn while rotating the N component holders continuously about the rotation axis for each of the imaging positions.

Also, a component holder imaging method according to the present disclosure, comprises starting rotations of N component holders arranged along a circumferential orbit centered at a predetermined rotation axis and held by a rotary head so as to be rotatable about the rotation axis, with N being an integer of 2 or more; and imaging the component holders at L imaging positions provided for the circumferential orbit, with L being an integer of 2 or more, wherein the method completes imaging of the N component holders by performing operation of imaging the component holder located at the imaging position in turn while rotating the N component holders continuously about the rotation axis for each of the imaging positions.

According to the disclosure (the component mounter and the component holder imaging method) having the above-described configurations, the L imaging positions are provided for the circumferential orbit along which the N component holders of the rotary head are arranged. While the N component holders are rotated continuously about the rotation axis, the operation of imaging the component holder located at the imaging position in turn is performed for each of the imaging positions. Therefore, in a period when the N component holders rotate by an angle not larger than a maximum angle around the rotation axis formed by a maximum interval out of intervals between the L imaging positions adjacent to each other along the circumferential orbit, imaging of the N component holders can be completed by locating each of the N component holders at any of the L imaging positions. As a result, it becomes possible to image the plurality of component holders of the rotary head efficiently.

The present disclosure allows efficient imaging of a plurality of component holders of a rotary head.

DETAILED DESCRIPTION

Figure 1:
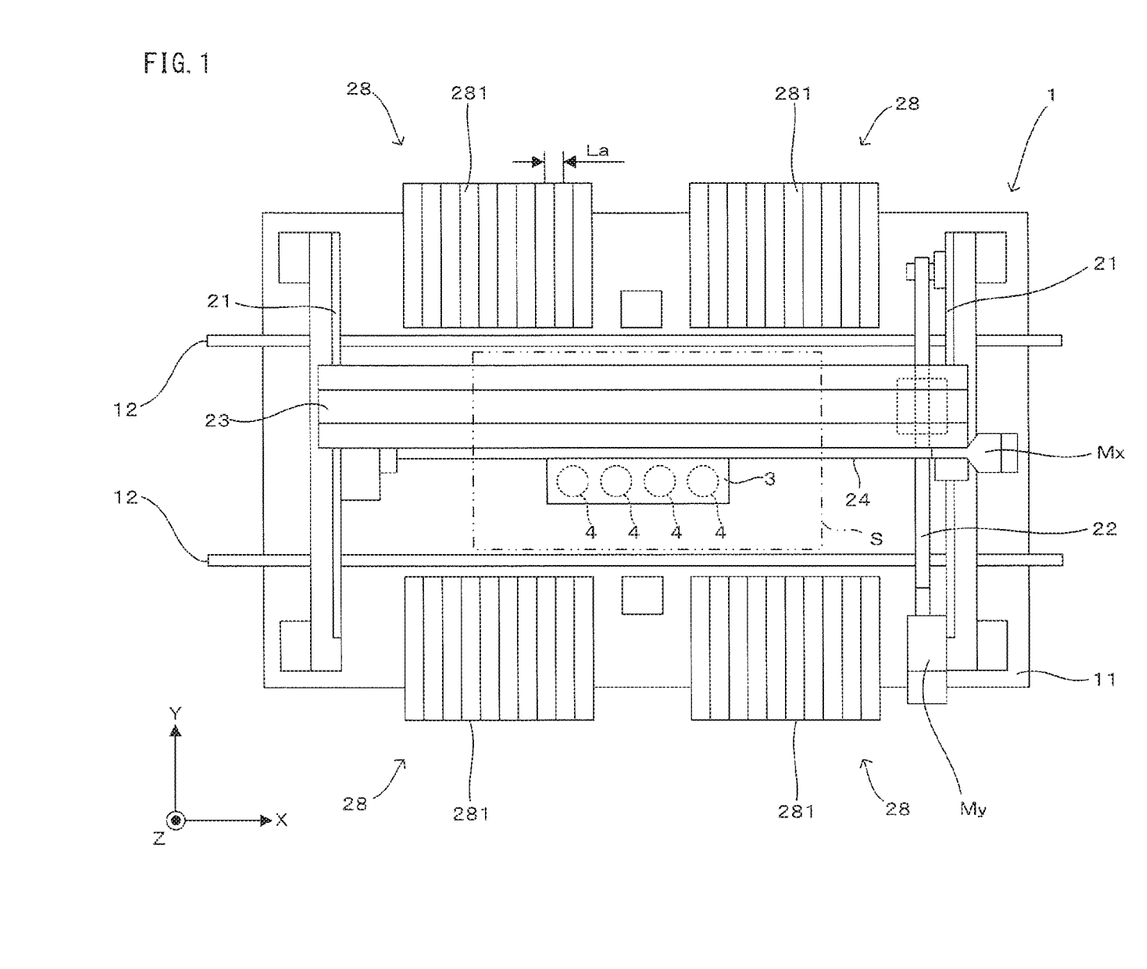
FIG. 1 is a partial plan view schematically showing a component mounter according to the present disclosure.
Figure 2:
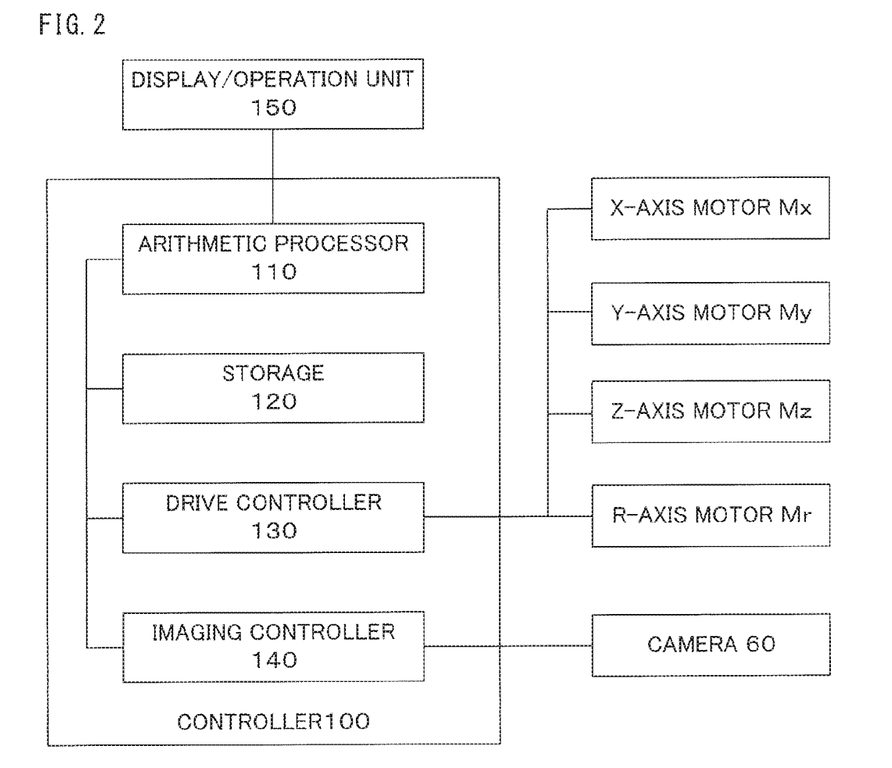
FIG. 2 is a block diagram showing an electrical configuration included to the component mounter of FIG. 1.

FIG. 1 is a partial plan view schematically showing a component mounter according to the present disclosure. FIG. 2 is a block diagram showing an electrical configuration included to the component mounter of FIG. 1. Where appropriate, an XYZ orthogonal coordinate system defining the vertical direction by the Z direction is shown in FIGS. 1 and 2, and drawings referred to below. As shown in FIG. 2, a component mounter 1 comprises a controller 100 configured to collectively control the entire apparatus. The controller 100 comprises an arithmetic processor 110 including a central processing unit (CPU) and a random access memory (RAM), and a storage 120 including a hard disk drive (HDD). The controller 100 further comprises a drive controller 130 configured to control a driving system of the component mounter 1, and an imaging controller 140 configured to control imaging of a nozzle described in detail later.

The arithmetic processor 110 controls the drive controller 130 by following a program stored in the storage 120, thereby realizing component mounting defined by the program. At this time, the arithmetic processor 110 controls the component mounting based on an image imaged by a camera 60 through the imaging controller 140. The component mounter 1 comprises a display/operation unit 150. The arithmetic processor 110 displays a status in the component mounter 1 on the display/operation unit 150 or receives instruction from an operator input through the display/operation unit 150.

As shown in FIG. 1, the component mounter 1 comprises a pair of conveyors 12, 12 provided on a base 11. The component mounter 1 mounts a component on a board S having been conveyed into a mounting process position (position of the board S in FIG. 1) by the conveyors 12 from an upstream position in the X direction (board conveying direction), and conveys the board S by the conveyors 12 from the mounting process position toward a downstream position in the X direction after mounting of the component on the board S is finished.

The component mounter 1 comprises a pair of Y-axis rails 21, 21 extending in the Y direction, a Y-axis ball screw 22 extending in the Y direction, and a Y-axis motor My configured to rotationally drive the Y-axis ball screw 22. While a head support member 23 is supported by the pair of Y-axis rails 21, 21 so as to be movable in the Y direction, the head support member 23 is fixed to a nut of the Y-axis ball screw 22. An X-axis ball screw 24 extending in the X direction and an X-axis motor Mx configured to rotationally drive the X-axis ball screw 24 are attached to the head support member 23. While a head unit 3 is supported by the head support member 23 so as to be movable in the X direction, the head unit 3 is fixed to a nut of the X-axis ball screw 24. Thus, the drive controller 130 can move the head unit 3 in the Y direction by rotating the Y-axis ball screw 22 by the Y-axis motor My or move the head unit 3 in the X direction by rotating the X-axis ball screw 24 by the X-axis motor Mx.

Two component supplying units 28 are arranged side by side in the X direction at each of both sides of the pair of conveyors 12, 12 in the Y direction. A plurality of tape feeders 281 are detachably mounted side by side at an arrangement pitch La in the X direction on each component supplying unit 28, and a reel on which a tape accommodating components in the form of small pieces such as integrated circuits, transistors and capacitors (chip electronic components) at predetermined intervals is wound is arranged to each tape feeder 281. The tape feeder 281 supplies the components in the tape by intermittently feeding the tape toward the head unit 3.

The head unit 3 includes a plurality of (four) mounting heads 4 arranged side by side in a straight line in the X direction. Each mounting head 4 sucks and mounts a component using a nozzle 40 (FIG. 3) as a component holder attached to the lower end of the mounting head 4. That is, the mounting head 4 moves to a position above the tape feeder 281 to suck a component supplied from the tape feeder 281. Specifically, the mounting head 4 moves down the nozzle 40 until the nozzle 40 abuts on the component. Then, the mounting head 4 moves up the nozzle 40 while generating negative pressure in the nozzle 40, thereby sucking the component. Next, the mounting head 4 moves to a position above the board S at the mounting process position and mounts the component on the board S. Specifically, the mounting head 4 moves down the nozzle 40 until the component abuts on the board S. Then, the mounting head 4 generates atmospheric pressure or positive pressure in the nozzle 40, thereby mounting the component. In this way, the mounting head 4 repeatedly executes a mounting turn of making the nozzle 40 holds a component received from the tape feeder 281 while being at the tape feeder 281, then moving to a position above the board S and making the nozzle 40 mount the component on the board S, and then returning from the position above the board S to a position above the tape feeder 281.

Figure 3:
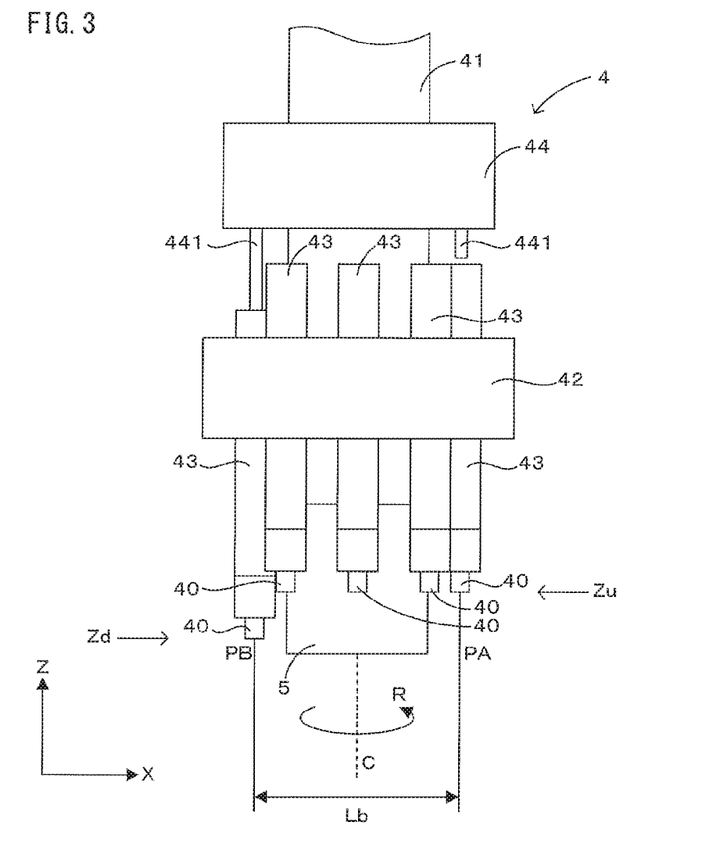
FIG. 3 is a partial front view schematically showing a lower end portion and its vicinity of an example of the mounting head.
Figure 4:
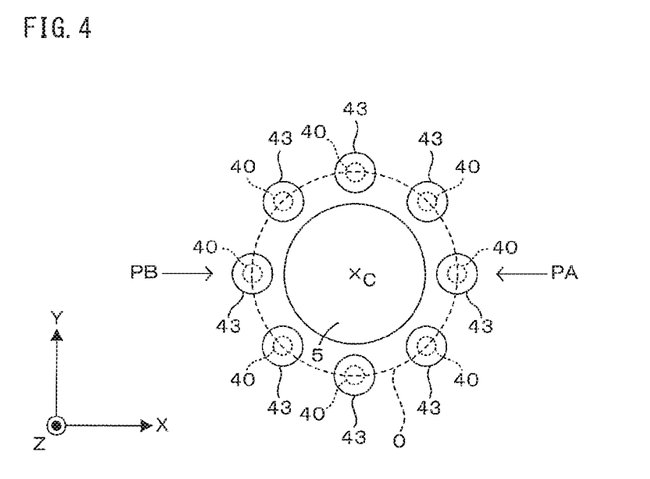
FIG. 4 is a partial plan view schematically showing the bottom of the mounting head of FIG. 3.

FIG. 3 is a partial front view schematically showing a lower end portion and its vicinity of an example of the mounting head. FIG. 4 is a partial plan view schematically showing the bottom of the mounting head of FIG. 3. As shown in FIGS. 3 and 4, each mounting head 4 is a rotary head with a plurality of nozzles 40 arranged in a circumferential pattern. The configuration of the mounting head 4 will be described next by referring to FIGS. 3 and 4 in combination. The four mounting heads 4 have a common configuration, so that the following description is for the configuration of one mounting head 4.

The mounting head 4 includes a main shaft 41 extending in the Z direction (vertical direction), and a nozzle holder 42 supported on the lower end of the main shaft 41. The nozzle holder 42 is supported so as to be rotatable in a rotation direction R about a rotation axis C (virtual axis) parallel to the Z direction. The nozzle holder 42 rotates in response to driving force given from an R-axis motor Mr (FIG. 2) provided at an upper end portion of the mounting head 4. Further, the nozzle holder 42 supports a plurality of (eight) lifting shafts 43 circumferentially arranged at an equal angle about the rotation axis C.

Each lifting shaft 43 is supported so as to be movable upward and downward and is biased upwardly by a biasing member not shown in the drawings. Each lifting shaft 43 has a lower end to which the nozzle 40 is attached detachably. In this way, the nozzle holder 42 supports the plurality of (eight) nozzles 40 arranged at an equal angle in a circumferential pattern centered at the rotation axis C. Thus, if the drive controller 130 outputs a rotation command to the R-axis motor Mr, the nozzle holder 42 is rotated by driving force given from the R-axis motor Mr to rotate the plurality of nozzles 40 integrally along a circumferential orbit O centered at the rotation axis C.

The main shaft 41 supports a nozzle lifting mechanism 44 provided above the plurality of lifting shafts 43. The nozzle lifting mechanism 44 includes two pressing members 441 arranged at an angle of 180° about the rotation axis C. The pressing members 441 move upward and downward independently of each other in response to driving force given from a Z-axis motor Mz (FIG. 2) provided in the nozzle lifting mechanism 44. Thus, if the drive controller 130 outputs a command to move down to the Z-axis motor Mz, the pressing member 441 moves down in response to driving force given from the Z-axis motor Mz. Therefore, each pressing member 441 moves down one lifting shaft 43 located right therebelow out of the plurality of lifting shafts 43, against a biasing force acting on the lifting shaft 43, thereby lowering the nozzle 40 to a lowered position Zd for suction or mounting of a component. If the drive controller 130 outputs a command to move up to the Z-axis motor Mz, the pressing member 441 moves up in response to driving force given from the Z-axis motor Mz. Therefore, the one lifting shaft 43 pressed by the pressing member 441 is moved up together with the nozzle 40 according to the biasing force and the nozzle 40 is lifted to a lifted position Zu. Note that, in FIG. 3, each of the lowered position Zd and the lifted position Zu is shown with respect to the lower ends of the nozzles 40.

In the mounting head 4 described above, a position directly below the pressing member 441 is a working position PA or PB for suction and mounting of a component by the nozzle 40. Specifically, in the mounting head 4, two working positions PA and PB are arranged at an angle of 180° about the rotation axis C in correspondence with the above-described arrangement of the two pressing members 441. On the other hand, as shown in FIG. 4, four pairs (nozzle pairs) of two nozzles 40 arranged at an interval of 180° about the rotation axis C (two nozzles 40 located on opposite sides across the rotation axis C) are provided in the nozzle holder 42, and 2×4 (eight) nozzles 40 are arranged along the circumferential orbit O. The two nozzles 40 paired in this way satisfy an arrangement relationship that the other nozzle 40 can be located at the working position PB at the same time as one nozzle 40 is located at the working position PA.

Thus, the drive controller 130 makes the R-axis motor Mr adjust the rotation angles of the plurality of nozzles 40 to locate each of two nozzles 40, 40 forming any one of the four nozzle pairs at the working position PA or PB, so that these nozzles 40, 40 become usable for suction and mounting of components.

For suction of a component at the working position PA, for example, the mounting head 4 is moved to a position above the component supplying unit 28 and the working position PA is positioned directly above the tape feeder 281. In this state, the nozzle 40 not sucking any component is lowered from the lifted position Zu to the lowered position Zd in the Z direction while being stopped at the working position PA in a rotating direction R. When the nozzle 40 comes into contact with a component supplied by the tape feeder 281, negative pressure is applied to the nozzle 40 to make the nozzle 40 suck the component supplied from the tape feeder 281. Next, the nozzle 40 sucking the component is lifted in the Z direction from the lowered position Zd to the lifted position Zu. A component is sucked at the working position PB in the same way. In particular, the two working positions PA and PB are arranged side by side in a straight line in the X direction, and a center-to-center distance Lb of the two nozzles 40, 40 forming a pair is equal to the arrangement pitch La (FIG. 1) with which the tape feeders 281 are arranged in the X direction. Thus, the two nozzles 40, 40 located at the working positions PA, PB can simultaneously suck components from the tape feeders 281, 281.

For mounting of the component at the working position PA, the mounting head 4 is moved to a position above the board S and the working position PA is positioned directly above a mounting target site of the board S. In this state, the nozzle 40 sucking the component is lowered in the Z direction from the lifted position Zu to the lowered position Zd, while being stopped at the working position PA in the rotation direction R. When the component comes into contact with board S, atmospheric pressure or positive pressure is applied to the nozzle 40 to mount the component from the nozzle 40 on the board S. Next, the nozzle 40 from which the component has been removed is moved up in the Z direction from the lowered position Zd to the lifted position Zu. A component is mounted at the working position PB in the same way.

A light diffusion member 5 of a cylindrical shape is attached to the lower end of the main shaft 41 of the mounting head 4. The plurality of nozzles 40 are arranged so as to surround the light diffusion member 5. The light diffusion member 5 has a similar configuration to a diffusion member described in Japanese Patent Application Laid-Open No. 2012-238726, for example. The light diffusion member 5 is used for imaging of a side view of the nozzle 40 by an imaging unit 6 (FIGS. 5 and 6) described next.

Figure 5:
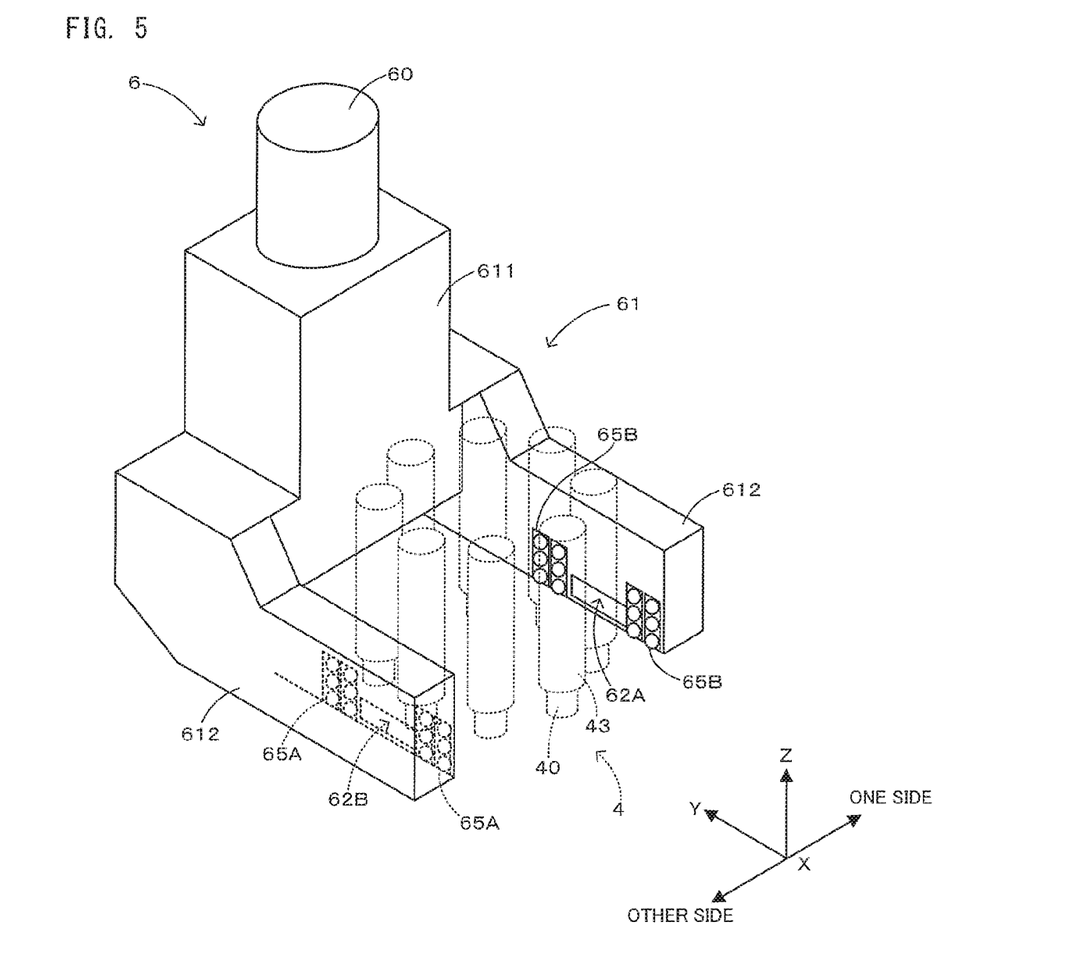
FIG. 5 is a partial perspective view schematically showing the appearance of the imaging unit.
Figure 6:
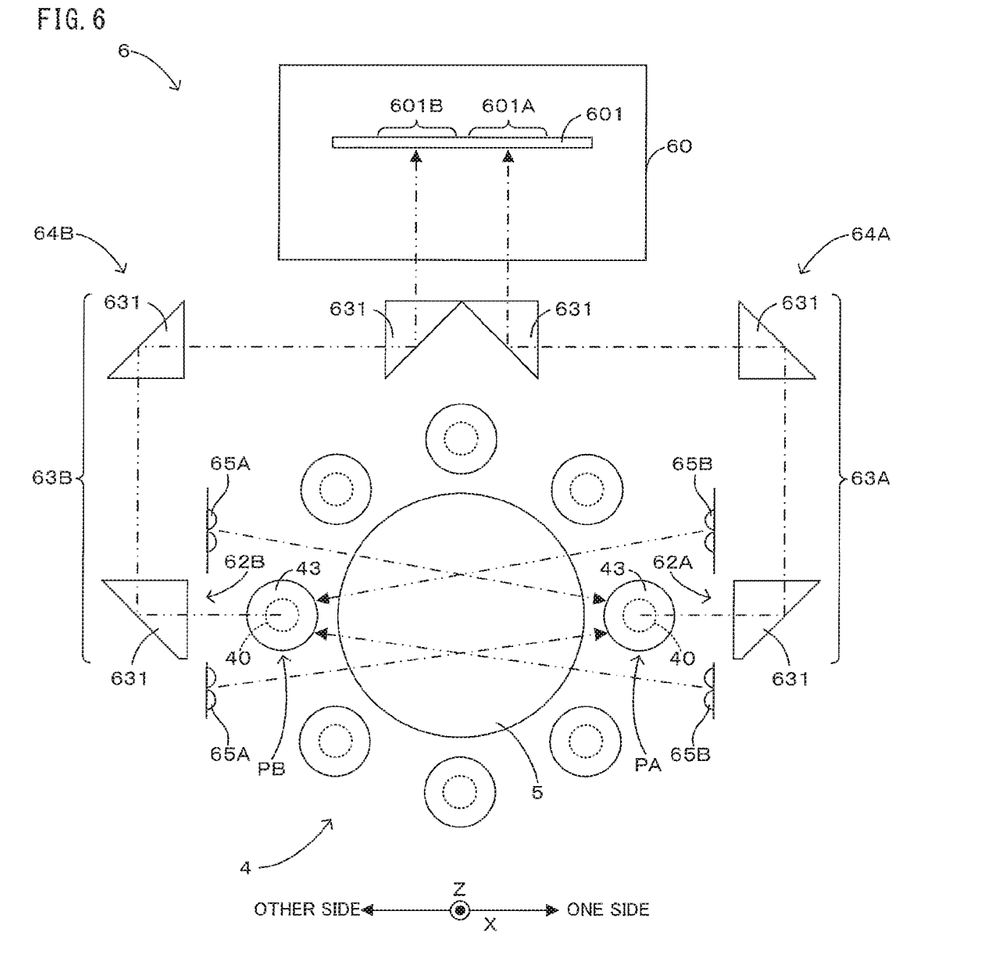
FIG. 6 is a schematic view equivalent to an optical configuration belonging to the imaging unit of FIG. 5.

The configuration of the imaging unit 6 will be described next by referring to FIGS. 5 and 6 in combination. FIG. 5 is a partial perspective view schematically showing the appearance of the imaging unit. FIG. 6 is a schematic view equivalent to an optical configuration belonging to the imaging unit of FIG. 5. To show relationship with the mounting head 4, the configuration of the mounting head 4 is partially illustrated in FIGS. 5 and 6. The imaging unit 6 includes the camera 60 and images an image of a side view of the nozzle 40 at the working position PA or PB by using the camera 60.

The imaging unit 6 includes a housing 61 which includes a body part 611 having an inverted T-shape in a side view from the Y direction and having the camera 60 mounted on an upper part and two nozzle facing parts 612, 612 projecting in the Y direction from both ends of the body part 611 in the X direction. The imaging unit 6 is arranged in such a manner that the plurality of nozzles 40 are located between the two nozzle facing parts 612, 612 from the X direction and is fixed to the main shaft 4 of the mounting head 4. In this way, the imaging unit 6 is configured integrally with the mounting head 4 and movable together with the mounting head 4.

A first window 62A facing the working position PA on one side in the X direction is provided in an inner side wall of the nozzle facing part 612 on one side in the X direction, and a first optical system 63A including an optical elements 631 such as prisms, mirrors and lenses is provided in the nozzle facing part 612 on the one side and the body part 611. Light incident on the first window 62A from the working position PA is guided to the camera 60 by the first optical system 63A. In this way, a first range 601A of a solid-state imaging device 601 built in the camera 60 receives the light from the working position PA. That is, a first imaging section 64A including the first window 62A, the first optical system 63A and the first range 601A of the solid-state imaging device 601 is arranged at one side of the mounting head 4. This first imaging section 64A faces the working position PA provided with respect to one side surface of the mounting head 4 and images the working position PA.

As described above, the nozzle 40 is lifted and lowered between the lifted position Zu and the lowered position Zd in response to upward movement and downward movement of the pressing member 441. Meanwhile, the first window 62A is arranged so as to face the tip of the nozzle 40 at the lifted position Zu at the working position PA. The first imaging section 64A images an image of the tip of the nozzle 40 at the lifted position Zu at the working position PA from the X direction (horizontal direction), thereby obtaining a side view image of the nozzle 40.

A first illuminators 65A configured to irradiate illumination light used in the imaging of the first imaging section 64 is arranged in an inner side wall of the nozzle facing part 612 on the other side in the X direction. This first illuminator 65A includes a plurality of LEDs (Light Emitting Diodes) arranged in matrix on each of both sides of a second window 62B, and irradiates light toward the working position PA from the other side in the X direction. In this way, light emitted from the first illuminators 65A arranged at the other side of the mounting head 4 in the X direction is irradiated to the working position PA after being diffused by the light diffusing member 5.

As described above, the first imaging section 64A is arranged on the one side with respect to the mounting head 4 and faces the working position PA at the side surface of the mounting head 4 on the one side. Meanwhile, the first illuminator 65A irradiates light toward the working position PA from the opposite side with respect to the mounting head 4. Thus, the first imaging section 64A obtains a silhouette image of the nozzle 40 by imaging an image of light irradiated by the first illuminator 65A from the back surface of the nozzle 40 at the working position PA. The silhouette image is transferred from the solid-state image device 601 to the imaging controller 140 and used for determining whether a component has been sucked or mounted successfully by the nozzle 40.

A second imaging section 64B having a configuration corresponding to that of the first imaging section 64A is arranged on the other side with respect to the mounting head 4. Specifically, in the second imaging section 64B, light incident on the second window 62B from the working position PB is guided by a second optical system 63B to a second range 601B (a range adjacent to the first range 601A) of the solid-state image device 601. The second imaging section 64B images an image of the tip of the nozzle 40 at the lifted position Zu at the working position PB from the X direction (horizontal direction), thereby obtaining a side view image of the nozzle 40.

A second illuminator 65B having a configuration corresponding to that of the first illuminator 65A is provided in the inner wall of the nozzle facing part 612 on the one side in the X direction. The second illuminator 65B irradiates light toward the working position PB from the one side in the X direction. Specifically, the second imaging section 64B obtains a silhouette image of the nozzle 40 at the working position PB.

Figure 7:
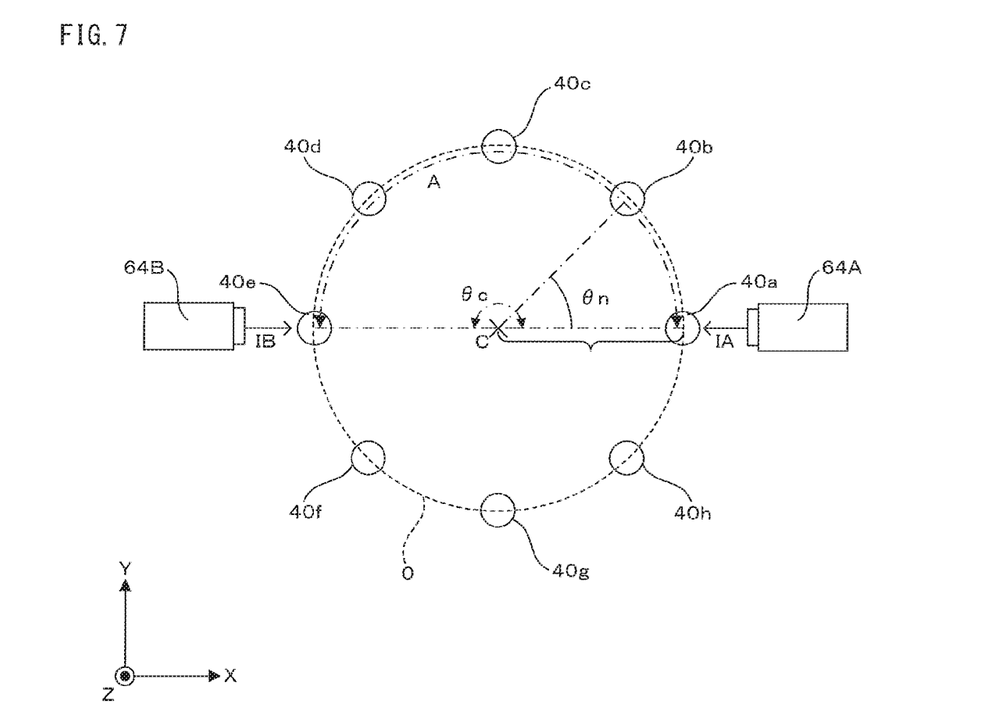
FIG. 7 is a partial plan view schematically showing a relationship of a position of imaging by each imaging section of the imaging unit and the nozzles.

As described above, the imaging unit 6 includes the first imaging section 64A and the second imaging section 64B. An imaging position IA (FIG. 7) where an image of the nozzle 40 is imaged by the first imaging section 64A coincides with the working position PA of the nozzle 40. An imaging position IB (FIG. 7) where an image of the nozzle 40 is imaged by the second imaging section 64B coincides with the working position PB of the nozzle 40. FIG. 7 shows positions of such imaging by the imaging sections 64A and 64B and the positions of the nozzles 40 relative to each other.

FIG. 7 is a partial plan view schematically showing a relationship of a position of imaging by each imaging section of the imaging unit and the nozzles. To distinguish the plurality of nozzles 40, these nozzles 40 are identified by different signs 40a to 40h in FIG. 7. As shown in FIG. 7, the N (eight) nozzles 40a to 40h are arranged along the circumferential orbit O while being separated by equal angles (=θn=360°/N=45°) around the rotation axis C. Meanwhile, the L (two) imaging positions IA and IB are provided for the circumferential orbit O while being separated by equal angles θc (=360°/L=180°) around the rotation axis C. The imaging positions IA and IB are adjacent to each other at an interval A along the circumferential orbit O. Thus, at least two, or three or more (here, four) nozzles 40 can be present within a range of the angle θc formed between imaging positions IA and IB adjacent to each other along the circumferential orbit O around the rotation axis C. The arithmetic processor 110 images the nozzles 40a to 40h at each of the imaging positions IA and IB in the following way by using the drive controller 130 and the imaging controller 140.

Figure 8:
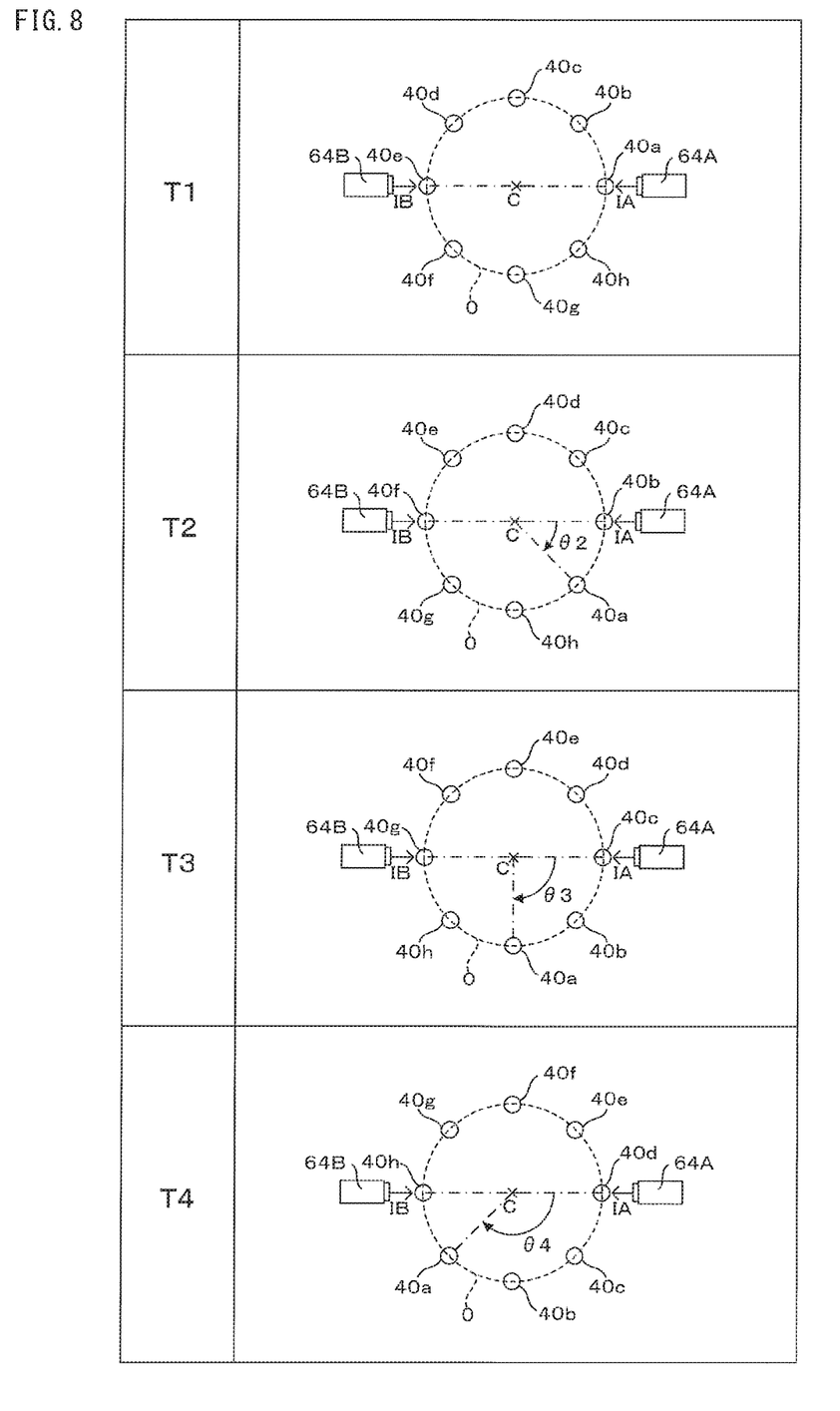
FIG. 8 is a partial plan view schematically showing an example of an imaging sequence executed by the arithmetic processor.

FIG. 8 is a partial plan view schematically showing an example of an imaging sequence executed by the arithmetic processor. At time T1 of start of the imaging sequence, the nozzles 40a and 40e forming a nozzle pair are located at the imaging positions IA and IB respectively. The arithmetic processor 110 images the nozzle 40a located at the imaging position IA and the nozzle 40e located at the imaging position IB simultaneously. Further, the arithmetic processor 110 starts rotating the eight nozzles 40a to 40h in one direction (clockwise direction). At time T2 when the nozzles 40a to 40h have been rotated by an angle θ2 (=θn=45°) from the time T1, the nozzles 40b and 40f forming a nozzle pair reach the imaging positions IA and IB respectively and the nozzles 40b and 40f are imaged simultaneously. At time T3 when the nozzles 40a to 40h have been rotated by an angle θ3 (=θn×2=90°) from the time T1, the nozzles 40c and 40g forming a nozzle pair reach the imaging positions IA and IB respectively and the nozzles 40c and 40g are imaged simultaneously. At time T4 when the nozzles 40a to 40h have been rotated by an angle θ3 (=θn×3=135°) from the time T1, the nozzles 40d and 40h forming a nozzle pair reach the imaging positions IA and IB respectively and the nozzles 40d and 40h are imaged simultaneously. As described above, while the eight nozzles 40a to 40h are rotated continuously in the one direction, the four nozzles 40a to 40d to come to the imaging position IA in turn are imaged and the four nozzles 40e to 40h to come to the imaging position IB in turn are imaged. In this way, each time the nozzle 40 comes to the imaging position IA or IB, this nozzle 40 is imaged. When imaging of all the nozzles 40 is completed, the imaging sequence is finished.

The arithmetic processor 110 executes the imaging sequence concurrently with the mounting turn, thereby contributing to efficient imaging of the eight nozzles 40 of the mounting head 4. More specifically, the arithmetic processor 110 executes the imaging sequence in a period when the mounting head 4 moves from a position above the tape feeder 281 to a position above the board S after finishing suction of a component from the tape feeder 281 by using each of the eight nozzles 40a to 40h during the mounting turn. In this occasion, the arithmetic processor 110 determines suction of a component by each of the nozzles 40a to 40h based on an imaged image of each of the eight nozzles 40a to 40h. The arithmetic processor 110 determines that a nozzle 40 not having a component at its lower end has failed in suction of a component. The arithmetic processor 110 further determines the thickness or posture of a component sucked by the nozzle 40 based on an imaged image, if necessary. As a result, it becomes possible to determine suction of a component by each of the eight nozzles 40 efficiently.

The arithmetic processor 110 executes the imaging sequence in a period when the mounting head 4 returns from a position above the board S to a position above tape feeder 281 after finishing mounting of a component on the board S by using each of the eight nozzles 40a to 40h during the mounting turn. In this occasion, the arithmetic processor 110 determines the presence or absence of a nozzle 40 with a component attached to its lower end based on an imaged image of each of the eight nozzles 40a to 40h. If the arithmetic processor 110 determines that none of the nozzles 40a to 40h has an attached component, the arithmetic processor 110 determines that the nozzles 40a to 40 have succeeded in mounting of components. The arithmetic processor 110 determines that a nozzle 40 determined to have an attached component has failed in mounting of the component. As a result, it becomes possible to determine the presence or absence of attachment of a component to each of the eight nozzles 40 efficiently.

As described above, in this embodiment, the two imaging positions IA and IB are provided for the circumferential orbit O along which the eight nozzles 40 of the mounting head 4 are arranged. While the eight nozzles 40 are rotated continuously about the rotation axis C, an operation of imaging the nozzles 40 located at the imaging positions IA and IB in turn is performed for each of the imaging positions IA and IB. Therefore, in a period when the eight nozzles 40 rotate by the angle θ4 not larger than the angle θc around the rotation axis C formed by the interval A between the two imaging positions IA and IB adjacent to each other along the circumferential orbit O, imaging of the eight nozzles 40 can be completed by locating each of the eight nozzles 40 at one of the two imaging positions IA and IB. As a result, it becomes possible to image the plurality of nozzles 40 of the mounting head 4 efficiently.

The two imaging positions IA and IB are separated by an angle of 180° around the rotation axis C. Thus, imaging of the eight nozzles 40 can be completed in a period when the eight nozzles 40 rotate by 180° at maximum, thereby allowing efficient imaging of the eight nozzles 40 of the mounting head 4.

The eight nozzles 40 include four nozzles pairs each including two nozzles 40 separated by an angle of 180° around the rotation axis C. The arithmetic processor 110 makes the imaging unit 6 simultaneously image the two nozzles 40 forming the nozzle pair and located at the two imaging positions IA and IB simultaneously. This achieves efficient imaging of the eight nozzles 40 of the mounting head 4.

In particular, each of the eight nozzles 40 of the mounting head 4 forms a nozzle pair together with a different one of the nozzles 40. The arithmetic processor 110 images the two nozzles 40 forming the nozzle pair simultaneously. This configuration makes it possible to complete imaging of the eight nozzles 40 with a frequency half a frequency in a case of imaging the eight nozzles 40 separately, thereby allowing efficient imaging of the eight nozzles 40 of the mounting head 4.

In this embodiment, the component mounter 1 corresponds to an example of the "component mounter" of the present disclosure. The mounting head 4 corresponds to an example of the "rotary head" of the present disclosure. The nozzle 40 corresponds to an example of the "component holder" of the present disclosure. The rotation axis C corresponds to an example of the "rotation axis" of the present disclosure. The circumferential orbit O corresponds to an example of the "circumferential orbit" of the present disclosure. The imaging unit 6 corresponds to an example of the "imaging unit" of the present disclosure. The arithmetic processor 110 corresponds to an example of the "controller" of the present disclosure. The component supplying unit 28 corresponds to an example of the "component supplying unit" of the present disclosure. The conveyors 12, 12 correspond to an example of the "board support unit" of the present disclosure.

The present disclosure is not limited to the above-described embodiment. Various changes are applicable to the above-described embodiment within a range not deviating from the subject of the disclosure. For example, the angle around the rotation axis C formed between the imaging positions IA and IB is not limited to 180° but may be an angle different from 180°.

The above-described description of the embodiment is intended for the configuration with the two imaging positions IA and IB (specifically, the configuration where "L"=2). However, this is not the only number of imaging positions but three or more imaging positions may be provided (specifically, "L" may be three or more). The configuration of the imaging unit 6 shown in FIG. 9 is applicable.

Figure 9:
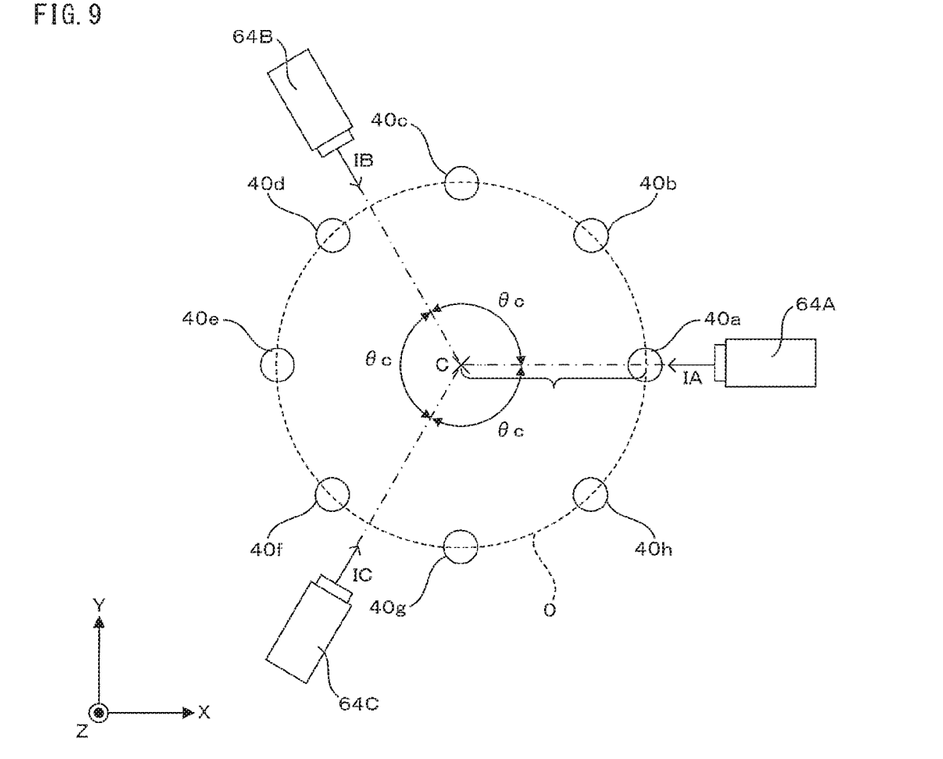
FIG. 9 is a partial plan view schematically showing relationship between each imaging section of an imaging unit and nozzles according to a modification.

FIG. 9 is a partial plan view schematically showing relationship between each imaging section of an imaging unit and nozzles according to a modification. In the modification shown in FIG. 9, three first imaging sections 64A, 64B, and 64C face three imaging positions IA, IB, and IC respectively to allow imaging of side views of nozzles 40 located at each of the imaging positions IA, IB, and IC. The imaging positions IA, IB, and IC are provided for the circumferential orbit O while being separated by equal angles θc (=360°/3=120°) around the rotation axis C.

While rotating the eight nozzles 40 continuously, the arithmetic processor 110 performs an operation of imaging the nozzles 40 located at the imaging positions IA, IB and IC in turn for each of the imaging positions IA, IB and IC. Therefore, in a period when the eight nozzles 40 rotate by an angle not larger than the angle θc around the rotation axis C formed by intervals between the three imaging positions IA and IB adjacent to each other along the circumferential orbit O, imaging of the eight nozzles 40 can be completed by locating each of the eight nozzles 40 at any of the three imaging positions IA, IB, and IC. Specifically, imaging of the eight nozzles 40 can be completed in a period when the eight nozzles 40 rotate by 120° at maximum. As a result, it becomes possible to image the images of the plurality of nozzles 40 of the mounting head 4 efficiently.

In a configuration with three or more imaging positions, angles around the rotation axis C formed between imaging positions adjacent to each other along the circumferential orbit O are not required to be equal but may differ from each other.

Timing of executing the imaging sequence is not limited to the above-described example. For example, in the above-described embodiment, the imaging sequence is executed both in a period when the mounting head 4 moves from the tape feeder 281 to the board S and in a period when the mounting head 4 returns from the board S to the tape feeder 281 during the mounting turn. Alternatively, the imaging sequence may be executed only in one of these periods. If control is executed so as to image each nozzle 40 and determine the state of suction of a component by the nozzle 40 when the nozzle 40 having sucked the component supplied from the tape feeder 281 has moved up to the lifted position Zu, for example, the imaging sequence may be suspended in the period when the mounting head 4 moves from the tape feeder 281 to the board S.

The working positions PA and PB coincide with the imaging positions IA and IB respectively. However, even if the working positions PA and PB do not coincide with the imaging positions IA and IB, the above-described imaging sequence can still be executed in the similar way.

The number of the working positions PA and PB is not limited to the number given in the above-described example. The above-described imaging sequence can still be executed in the similar way to the mounting head 4 with a single working position PA.

The number of the nozzles 40 of the mounting head 4 is not limited to the number given in the above-described example. The number of the nozzles 40 may be eight or more (specifically, "N" may be 8 or more), or less than eight (specifically, "N" may be less than 8).

A direction in which the nozzle 40 is rotated in the imaging sequence is not limited to the clockwise direction illustrated in FIG. 8 but may be an anticlockwise direction.

In FIG. 8, rotations of the nozzles 40 are started while the nozzles 40a and 40e are at the imaging positions IA and IB respectively. Specifically, the nozzles 40a and 40e out of the N nozzles 40 to respectively locate at the imaging positions IA and IB first are imaged and then rotations of the N nozzles 40 are started. Subsequent to the nozzles 40a and 40b as first imaging targets, the nozzles 40b to 40d, 40f to 40h are located in turn at the imaging position IA, IB. The subsequent nozzles 40b to 40d, 40f to 40h are imaged to complete imaging of the N nozzles 40. Alternatively, rotations of the nozzles 40 may be started while the nozzles 40 deviate from the imaging positions IA and IB. In this case, after rotations of the N nozzles 40 are started, images of the nozzles 40a to 40d, 40e to 40f to locate at the imaging position IA, IB in turn are imaged. In this way, imaging of the N nozzles 40 can be completed. What is meant is that imaging of the N nozzles 40 may be completed by changing nozzles 40 to locate at the imaging positions IA and IB by rotating the N nozzles 40 continuously, and imaging the nozzles 40 to locate at the imaging positions IA and IB in turn.

A member usable as the "component holder" is not limited to the nozzle 40 described above that holds a component under suction. Thus, the "component holder" may also be a member to hold a component by gripping the component, for example.

As understood from the specific embodiment of the present disclosure described above, according to the present disclosure, for example, the component mounter may be configured so that in the imaging unit, L=2, and two imaging positions are separated by an angle of 180° around the rotation axis. In this configuration, imaging of the N component holders can be completed in a period when the N component holders rotate by 180° at maximum, thereby allowing efficient imaging of the plurality of component holders of the rotary head.

The component mounter may be configured so that the N component holders include a P component holder pair including two of the component holders separated by an angle of 180° around the rotation axis, P being an integer of 1 or more, and the controller makes the imaging unit simultaneously image the two component holders forming the component holder pair and located at the two imaging positions simultaneously. This configuration allows simultaneously imaging of the two component holders forming the component holder pair, thereby contributing to efficient imaging of the plurality of component holders of the rotary head.

The component mounter may be configured so that in the rotary head, N=2×P, and (2×P) component holders are arranged along the circumferential orbit. This configuration makes it possible to complete imaging of the N component holders with a frequency half a frequency in a case of imaging the N component holders separately, thereby contributing to efficient imaging of the plurality of component holders of the rotary head.

The component mounter may be configured to further comprises: a component supplying unit configured to supply a component; and a board support unit configured to support a board, wherein the rotary head executes a mounting turn of making the component holder hold a component from the component supplying unit while being at a position above the component supplying unit, then moving to a position above the board and making the component holder mount the component on the board, and then returning from the position above the board to the position above the component supplying unit, and the controller determines a state of the component holder by executing the imaging sequence concurrently with the mounting turn. In this configuration, imaging of the component holder located at the imaging position in turn is concurrently with the mounting turn, thereby contributing to efficient imaging of the plurality of component holders of the rotary head.

Specifically, the component mounter may be configured so that the controller determines the presence or absence of attachment of a component to each of the N component holders by executing the imaging sequence in a period when the rotary head returns from the position above the board to the position above the component supplying unit during the mounting turn. This makes it possible to determine the presence or absence of attachment of a component to each of the N component holders efficiently.

The component mounter may be configured so that the controller determines holding of a component by each of the N component holders by executing the imaging sequence in a period when the rotary head moves from the position above the component supplying unit to the position above the board during the mounting turn. This makes it possible to determine holding of a component by each of the N component holders efficiently.

The component mounter may be configured so that in the imaging unit, L=3, and three imaging positions are separated by an angle of 120° around the rotation axis. In this configuration, imaging of the N component holders can be completed in a period when the N component holders rotate by 120° at maximum, thereby allowing efficient imaging of the plurality of component holders of the rotary head.

What is claimed is:

1. A component mounter comprising:
a rotary head that holds N component holders arranged along a circumferential orbit centered at a predetermined rotation axis and is configured to rotate integrally about the rotation axis, with N being an integer of 2 or more;
an imager configured to have L imaging positions provided for the circumferential orbit and configured to image L component holders out of the N component holders, the L component holders being located at a respective imaging position of the L imaging positions, with L=2 and the two imaging positions are separated by an angle of 180° around the rotation axis; and
a controller configured to execute an imaging sequence to complete imaging of the N component holders by controlling the imager to perform an operation of imaging the L component holders out of the N component holders, the L component holders being located at the respective imaging position of the two imaging positions while rotating the N component holders continuously about the rotation axis, wherein
the imager includes:
two facing parts arranged in such a manner that the N component holders are located between the two facing parts from a horizontal direction;
a camera that images the L component holders located at the respective imaging positions of the two imaging positions from the horizontal direction by receiving light incident on a window provided in each of the two facing parts and facing the respective imaging position of the two imaging positions in the horizontal direction; and an illuminator provided in each of the two facing parts and irradiating light toward the two imaging positions.

2. The component mounter according to claim 1, wherein:
the N component holders include P component holder pairs including two of the component holders separated by an angle of 180° around the rotation axis, with P being an integer of 1 or more, and the controller controls the imager to simultaneously image the two component holders forming a first component holder pair of the P component holder pairs located at the two imaging positions simultaneously.

3. The component mounter according to claim 2, wherein in the rotary head, N=2×P, and (2×P) component holders are arranged along the circumferential orbit.

4. The component mounter according to claim 3, further comprising:
a component supplier configured to supply a component; and
a board support configured to support a board, wherein the rotary head executes a mounting operation of causing one component holder of the N component holders to hold a component from the component supplier while the one component holder of the N component holders is at a position above the component supplier, to move the one component holder of the N component holders to a position above the board and to mount the component on the board, and then return the one component holder of the N component holders from the position above the board to the position above the component supplier, and
the controller determines a state of the one component holder of the N component holders by executing the imaging sequence concurrently with the mounting operation.

5. The component mounter according to claim 4, wherein the controller determines the presence or absence of attachment of a component to each component holder of the N component holders by executing the imaging sequence in a period when the rotary head returns from the position above the board to the position above the component supplier during the mounting operation.

6. The component mounter according to claim 4, wherein the controller determines holding of a component by each component holder of the N component holders by executing the imaging sequence in a period when the rotary head moves from the position above the component supplier to the position above the board during the mounting operation.

7. The component mounter according to claim 2, further comprising:
a component supplier configured to supply a component; and
a board support configured to support a board, wherein the rotary head executes a mounting operation of causing one component holder of the N component holders to hold a component from the component supplier while the one component holder of the N component holders is at a position above the component supplier, to move the one component holder of the N component holders to a position above the board and to mount the component on the board, and then return the one component holder of the N component holders from the position above the board to the position above the component supplier, and
the controller determines a state of the one component holder of the N component holders by executing the imaging sequence concurrently with the mounting operation.

8. The component mounter according to claim 7, wherein the controller determines the presence or absence of attachment of a component to each component holder of the N component holders by executing the imaging sequence in a period when the rotary head returns from the position above the board to the position above the component supplier during the mounting operation.

9. The component mounter according to claim 7, wherein the controller determines holding of a component by each component holder of the N component holders by executing the imaging sequence in a period when the rotary head moves from the position above the component supplier to the position above the board during the mounting operation.

10. The component mounter according to claim 1, further comprising:
a component supplier configured to supply a component; and
a board support configured to support a board, wherein the rotary head executes a mounting operation of causing one component holder of the N component holders to hold a component from the component supplier while the one component holder of the N component holders is at a position above the component supplier, to move the one component holder of the N component holders to a position above the board and to mount the component on the board, and then return the one component holder of the N component holders from the position above the board to the position above the component supplier, and
the controller determines a state of the one component holder of the N component holders by executing the imaging sequence concurrently with the mounting operation.

11. The component mounter according to claim 10, wherein the controller determines the presence or absence of attachment of a component to each component holder of the N component holders by executing the imaging sequence in a period when the rotary head returns from the position above the board to the position above the component supplier during the mounting operation.

12. The component mounter according to claim 11, wherein the controller determines holding of a component by each component holder of the N component holders by executing the imaging sequence in a period when the rotary head moves from the position above the component supplier to the position above the board during the mounting operation.

13. The component mounter according to claim 10, wherein the controller determines holding of a component by each component holder of the N component holders by executing the imaging sequence in a period when the rotary head moves from the position above the component supplier to the position above the board during the mounting operation.

14. The component mounter according to claim 1, wherein the controller determines holding of a component by each component holder of the N component holders by executing the imaging sequence in a period when the rotary head moves from the position above the component supplier to the position above the board during the mounting operation.

15. The component mounter according to claim 1, wherein the illuminator includes a first illuminator provided in a first facing part of the two facing parts on one side of the two imaging positions, and the first illuminator irradiates light toward a second facing part of the two facing parts on the other side of the two imagining positions, and the illuminator includes a second illuminator provided in the second facing part, and the second illuminator irradiates light toward the first facing part.

16. The component mounter according to claim 1, further comprising a light diffusing member, the two facing parts include a first facing part and a second facing part, the illuminator includes a first illuminator positioned in the first facing part and a second illuminator positioned in a second facing part, and the two imaging positions include a first imaging position and a second imaging position, wherein light emitted from the first illuminator is irradiated toward the second imaging position after being diffused by the light diffusing member.

17. A component holder imaging method comprising:
   starting rotations of N component holders arranged along a circumferential orbit centered at a predetermined rotation axis and held by a rotary head rotatably about the rotation axis, with N being an integer of 2 or more; and
   imaging L component holders out of the N component holders at L imaging positions provided for the circumferential orbit, with L=2 and the two imaging positions are separated by an angle of 180° around the rotation axis, wherein
   the imaging of the N component holders is completed by performing—imaging of the L component holders out of the N component holders as they become located at any of the two imaging positions while rotating the N component holders continuously about the rotation axis,
   arranging two facing parts in such a manner that the N component holders are located between the two facing parts from a horizontal direction;
   imaging the L component holders out of the N component holders, the L component holders each being located at a respective imaging position of the two imaging positions, from the horizontal direction by receiving light incident on a window provided in each of the two facing parts and facing the two imaging positions in the horizontal direction; and
   irradiating, in each of the two facing parts, light toward the two imaging positions.

* * * * *